US006486533B2

(12) United States Patent
Krishnamoorthy et al.

(10) Patent No.: US 6,486,533 B2
(45) Date of Patent: Nov. 26, 2002

(54) METALLIZATION STRUCTURES FOR MICROELECTRONIC APPLICATIONS AND PROCESS FOR FORMING THE STRUCTURES

(75) Inventors: Ahila Krishnamoorthy, Menands, NY (US); David J. Duquette, Loudonville, NY (US); Shyam P. Murarka, Clifton Park, NY (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/990,019

(22) Filed: Nov. 21, 2001

(65) Prior Publication Data

US 2002/0050628 A1 May 2, 2002

Related U.S. Application Data

(62) Division of application No. 09/386,188, filed on Aug. 31, 1999, which is a continuation of application No. PCT/US99/14939, filed on Jun. 30, 1999.
(60) Provisional application No. 60/091,691, filed on Jun. 30, 1998, and provisional application No. 60/114,512, filed on Dec. 31, 1998.

(51) Int. Cl.[7] ..................... H01L 27/082; H01L 27/102; H01L 29/70; H01L 31/11
(52) U.S. Cl. ........................................ 257/586; 257/661
(58) Field of Search ........................... 257/33, 37, 586, 257/661, 662, 663, 750, 758, 759, 760, 501

(56) References Cited

U.S. PATENT DOCUMENTS

| 3,878,066 A | 4/1975 | Dettke et al. |
| 3,904,493 A | 9/1975 | Losi et al. |
| 4,055,751 A | 10/1977 | Bussmann et al. |
| 4,090,926 A | 5/1978 | Matson |
| 4,132,605 A | 1/1979 | Tench et al. |
| 4,146,437 A | 3/1979 | O'Keefe |
| 4,181,760 A | 1/1980 | Feldstein |
| 4,235,648 A | 11/1980 | Richardson |
| 4,917,774 A | 4/1990 | Fisher |
| 4,948,473 A | 8/1990 | Phillippi |
| 5,028,560 A | * 7/1991 | Tsukamoto et al. |
| 5,098,544 A | 3/1992 | Brannan et al. |

(List continued on next page.)

FOREIGN PATENT DOCUMENTS

JP    WO 200005747    *  2/2000

OTHER PUBLICATIONS

Lowenheim, F.A., *Electroplating*, McGraw–Hill Book Co., New York, pp. 120–121, 1978.
Willard, H.H., et al., *Instrumental Methods of Analysis*, 5th ed., VanNostrand, New York, 1974, pp. 647–656.

*Primary Examiner*—David Nelms
*Assistant Examiner*—Phuc T. Dang
(74) *Attorney, Agent, or Firm*—Christensen O'Connor Johnson Kindness PLLC

(57) ABSTRACT

A metallized structure for use in a microelectronic circuit is set forth. The metallized structure comprises a dielectric layer, an ultra-thin film bonding layer disposed exterior to the dielectric layer, and a low-Me concentration, copper-Me alloy layer disposed exterior to the ultra-thin film bonding layer. The Me is a metal other than copper and, preferably, is zinc. The concentration of the Me is less than about 5 atomic percent, preferably less than about 2 atomic percent, and even more preferably, less than about 1 atomic percent. In a preferred embodiment of the metallized structure, the dielectric layer, ultra-thin film bonding layer and the copper-Me alloy layer are all disposed immediately adjacent one another. If desired, a primary conductor, such as a film of copper, may be formed exterior to the foregoing layer sequence. The present invention also contemplates methods for forming the foregoing structure as well as electroplating baths that may be used to deposit the copper-Me alloy layer.

46 Claims, 14 Drawing Sheets

U.S. PATENT DOCUMENTS

| | | |
|---|---|---|
| 5,151,168 A | 9/1992 | Gilton et al. |
| 5,192,403 A | 3/1993 | Chang et al. |
| 5,196,096 A | 3/1993 | Chang et al. |
| 5,223,118 A | 6/1993 | Sonneberg et al. |
| 5,234,573 A | 8/1993 | Takami |
| 5,308,796 A | 5/1994 | Feldman et al. |
| 5,316,974 A | 5/1994 | Crank |
| 5,364,510 A | 11/1994 | Carpio |
| 5,389,215 A | 2/1995 | Horiuchi et al. |
| 5,391,271 A | 2/1995 | Ludwig |
| 5,534,128 A | 7/1996 | Aso et al. |
| 5,789,320 A | 8/1998 | Andricacos et al. |
| 6,103,624 A | 8/2000 | Nogami et al. |
| 6,197,181 B1 | 3/2001 | Chen |
| 6,319,387 B1 * | 11/2001 | Krishnamoorthy et al. .  205/240 |

* cited by examiner

Figure 5 : Polarization curves in test solutions containing 45 g/l $ZnSO_4$ and 0 to 5 g/l $CuSO_4$ Figure 6 : Polarization curves in test solutions containing 45 g/l $ZnSO_4$ and 0 to 5 g/l $CuSO_4$ Figure 7 : Polarization curves in test solutions containing 40 g/l $ZnSO_4$ and 5 - 10 g/l $CuSO_4$ Figure 8 : Polarization curves in test solutions containing 35 g/l $ZnSO_4$ and 5 - 15 g/l $CuSO_4$ Figure 9 : Polarization curves in test solutions containing 30 g/l ZnSO$_4$ and 5 - 15 g/l CuSO$_4$ Figure 10: Polarization curves in test solutions containing 25 g/l $ZnSO_4$ and 5 - 20 g/l $CuSO_4$ Figure 11: Polarization curves in test solutions containing 20 g/l ZnSO$_4$ and 0 - 20 g/l CuSO$_4$ Figure 12 : Polarization curves showing the effect of ammonia and ethylene diamine Figure 13 : Polarization curves showing the effect of addition of small quantities of copper Cu deposit Cu-Zn alloy Zinc deposit

////////////////////////////////////////

Copper base material

Figure 14

METALLIZATION STRUCTURES FOR MICROELECTRONIC APPLICATIONS AND PROCESS FOR FORMING THE STRUCTURES

CROSS-REFERENCE TO RELATED APPLICATIONS

This application is a divisional application of U.S. application Ser. No. 09/386,188, filed Aug. 31, 1999, which is a continuation application of International PCT Patent Application No. PCT/US99/14939, designating the U.S., filed Jun. 30, 1999, and published in English under PCT Article 21(2), which claims priority from U.S. patent application Ser. No. 60/091,691, filed Jun. 30, 1998, and U.S. patent application Ser. No. 60/114,512, filed Dec. 31, 1998.

BACKGROUND OF THE INVENTION

An integrated circuit is an interconnected ensemble of devices formed within a semiconductor material and within a dielectric material that overlies a surface of the semiconductor material. Devices which may be formed within the semiconductor material include MOS transistors, bipolar transistors, diodes and diffused resistors. Devices which may be formed within the dielectric include thin-film resistors and capacitors. Typically, more than 100 integrated circuit die (IC chips) are constructed on a single 8 inch diameter silicon wafer. The devices utilized in each dice are interconnected by conductor paths formed within the dielectric. Typically, two or more levels of conductor paths, with successive levels separated by a dielectric layer, are employed as interconnections. The metallization used to form such interconnects likewise has applicability in the formation of discrete microelectronic components, such as read/write heads, on other substrate materials. In current practice, an aluminum alloy and silicon oxide are typically used for, respectively, the conductor and dielectric.

Delays in propagation of electrical signals between devices on a single dice limit the performance of integrated circuits. Such delays in propagation also limit the performance of discrete microelectronic components. More particularly, these delays limit the speed at which an integrated circuit or microelectronic component may process or otherwise conduct these electrical signals. Larger propagation delays reduce the speed at which the integrated circuit may process the electrical signals, while smaller propagation delays increase this speed. Accordingly, integrated circuit manufacturers seek ways in which to reduce the propagation delays.

For each interconnect path, signal propagation delay may be characterized by a time delay $\tau$. See E. H. Stevens, *Interconnect Technology*, QMC, Inc., July 1993. An approximate expression for the time delay, $\tau$, as it relates to the transmission of a signal between transistors on an integrated circuit is given by the equation:

$$\tau = RC[1 + (V_{SAT}/RI_{SAT})]$$

In this equation, R and C are, respectively, an equivalent resistance and capacitance for the interconnect path, and $I_{SAT}$ and $V_{SAT}$ are, respectively, the saturation (maximum) current and the drain-to-source potential at the onset of current saturation for the transistor that applies a signal to the interconnect path. The path resistance is proportional to the resistivity, $\rho$, of the conductor material. The path capacitance is proportional to the relative dielectric permittivity, $K_e$, of the dielectric material. A small value of $\tau$ requires that the interconnect line carry a current density sufficiently large to make the ratio $V_{SAT}/RI_{SAT}$ small. It follows, therefore, that a low-$\rho$ conductor that can carry a high current density and a low-$K_e$ dielectric should be utilized in the manufacture of high-performance integrated circuits.

To meet the foregoing criterion, copper interconnect lines within a low-$K_e$ dielectric will likely replace aluminum-alloy lines within a silicon oxide dielectric as the most preferred interconnect structure. See "Copper Goes Mainstream: Low-k to Follow", *Semiconductor International*, November 1997, pp. 67–70. Resistivities of copper films are in the range of 1.7 to 2.0 $\mu\Omega$cm. while resistivities of aluminum-alloy films are higher in the range of 3.0 to 3.5 $\mu\Omega$cm.

Despite the advantageous properties of copper, several problems must be addressed for copper interconnects to become viable in large-scale manufacturing processes.

Diffusion of copper is one such problem. Under the influence of an electric field, and at only moderately elevated temperatures, copper moves rapidly through silicon oxide. It is believed that copper also moves rapidly through low-$K_e$ dielectrics. Such copper diffusion causes failure of devices formed within the silicon.

Another problem is the propensity of copper to oxidize rapidly when immersed in aqueous solutions or when exposed to an oxygen-containing atmosphere. Oxidized surfaces of the copper are rendered non-conductive and thereby limit the current carrying capability of a given conductor path when compared to a similarly dimensioned non-oxidized copper path.

A still further problem with using copper in integrated circuits is that it is difficult to use copper in a multi-layer, integrated circuit structure with dielectric materials. Using traditional methods of copper deposition, copper adheres only weakly to dielectric materials.

Finally, because copper does not form volatile halide compounds, direct plasma etching of copper cannot be employed in fine-line patterning of copper. As such, copper is difficult to use in the increasingly small geometries required for advanced integrated circuit devices.

The semiconductor industry has addressed some of the foregoing problems and has adopted a generally standard interconnect architecture for copper interconnects. To this end, the industry has found that fine-line patterning of copper can be accomplished by etching trenches and vias in a dielectric, filling the trenches and vias with a deposition of copper, and removing copper from above the top surface of the dielectric by chemical-mechanical polishing (CMP). An interconnect architecture called dual damascene can be employed to implement such an interconnect structure and thereby form copper lines within a dielectric.

At least one of the processes in the formation of the dual-damascene architecture is particularly troublesome. More particularly, deposition of thin, uniform barrier and seed layers into high aspect ratio (depth/diameter) vias and high aspect ratio (depth/width) trenches is difficult. The upper portions of such trenches and vias tend to pinch-off before the respective trench and/or via is completely filled or layered with the desired material. This problem is further exacerbated when the interconnect structures formed in the trenches and vias include multiple layers. Conductivities of known barrier materials are negligible compared to the conductivity of copper; thus the conductance of narrow interconnect lines is markedly reduced by the barrier layer that must be interposed between the copper and dielectric.

The present inventors have found that deposition of lean alloys of copper may solve these problems. More particularly, the present inventors have determined that addition of zinc to copper in very low quantities assists in solving the diffusion and self-passivation problems and, further, have suggested a metallization structure that takes advantage of these qualities. Still further, the present inventors have developed an electroplating process that may be used to deposit the copper/zinc alloy that may be used in conjunction with the other processes employed to form the proposed metallization structure.

BRIEF SUMMARY OF THE INVENTION

A metallized structure for use in a microelectronic circuit is set forth. The metallized structure comprises a dielectric layer, an ultra-thin film bonding layer disposed exterior to the dielectric layer, and a low-Me concentration, copper-Me alloy layer disposed exterior to the ultra-thin film bonding layer. The Me is a metal other than copper and, preferably, is zinc. The concentration of the Me is less than about 5 atomic percent, preferably less than about 2 atomic percent, and even more preferably, less than about 1 atomic percent. In a preferred embodiment of the metallized structure, the dielectric layer, ultra-thin film bonding layer and the copper-Me alloy layer are all disposed immediately adjacent one another. If desired, a primary conductor, such as a film of copper, may be formed exterior to the foregoing layer sequence. The present invention also contemplates methods for forming the foregoing structure as well as electroplating baths that may be used to deposit the copper-Me alloy layer.

BRIEF DESCRIPTION OF THE SEVERAL VIEWS OF THE DRAWINGS

FIG. 14 illustrates the composition of an electrochemically deposited layer that was deposited on a copper rod in tests conducted with one embodiment of the disclosed alloy electroplating solution.

DETAILED DESCRIPTION OF THE INVENTION

Figure 1:
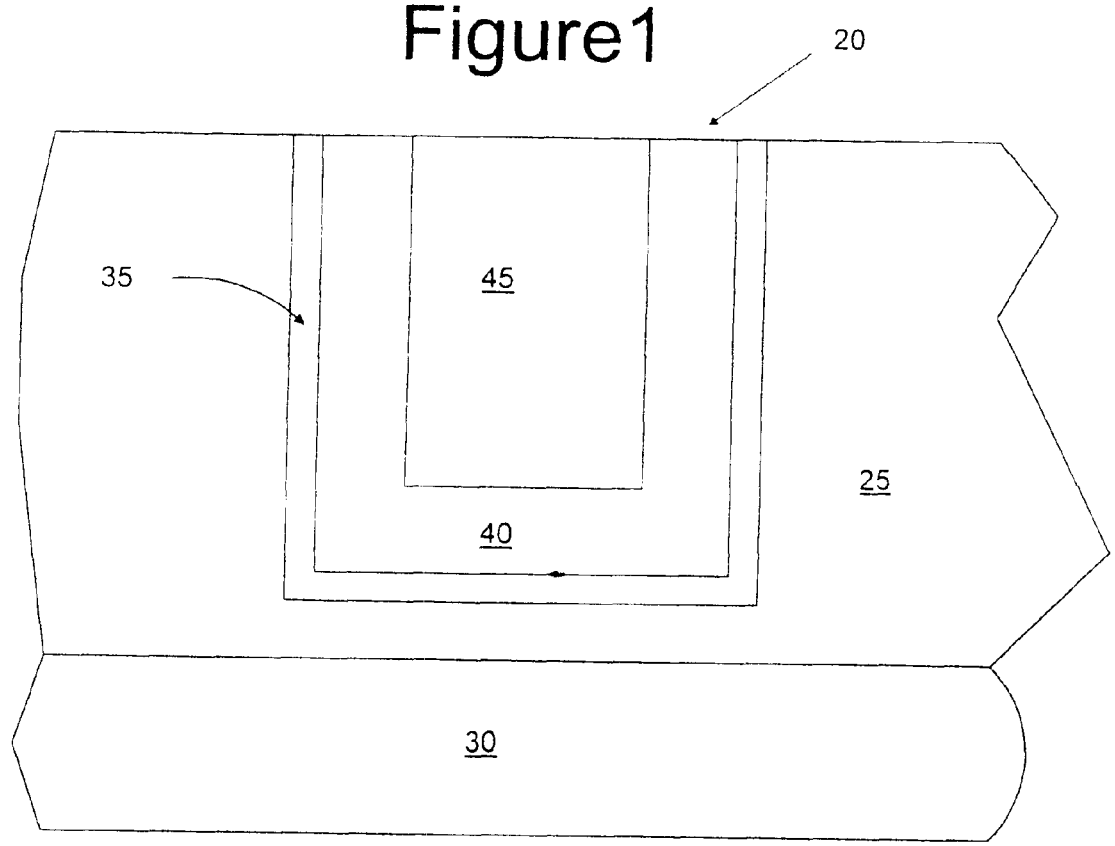
FIG. 1 illustrates a multilayer metallization structure constructed in accordance with one embodiment of the present invention.

FIG. 1 illustrates a multilayer metallization structure constructed in accordance with one embodiment of the present invention. As illustrated, the metallization structure, shown generally at 20, comprises a plurality of thin layers of conductive material deposited exterior to and, preferably, directly on a dielectric layer 25. In the specific embodiment shown here, the dielectric layer 25 is disposed exterior to and, preferably, on a substrate 30, such as a silicon semiconductor wafer. It will be recognized that the metallization structure 20 may be disposed exterior to a wide range of thin film layer and/or substrate material types and, further, may be constructed to conform to various surface geometries. The metallization structure 20 thus has applicability to diverse classes of microelectronic components and/or interconnects.

The composition of the dielectric layer 25 is generally dependent on the function of the metallization structure 20. When the metallization structure 20 is used to implement a post or line of an electrical interconnect network, the dielectric layer 25 is preferably comprised of a lowK material. When the metallization structure is used to implement a discrete microelectronic component such as a capacitor, however, the dielectric layer 25 is preferably comprised of a highK material. To increase adhesion between the dielectric layer 25 and a subsequent layer, such as ultra-thin bonding layer 35, the surface of the dielectric layer may be subject to an adhesion promoting process. For example, the dielectric surface may be subject to treatment in an atmosphere having a high ozone content. Alternatively, some form of mild mechanical or chemical abrading process may be used.

As shown in FIG. 1, the metallization structure 20 is comprised of an ultra-thin film bonding layer 35 disposed exterior to the dielectric layer 25, a low-zinc concentration, copper-zinc alloy layer 40 disposed exterior to the ultra-thin film bonding layer 35, and an optional primary conductive layer 45 disposed exterior to the copper-zinc alloy layer 40. In a preferred embodiment illustrated here in FIG. 1, each of the layers 35, 40 and 45 are immediately adjacent one another. As such, the copper-zinc alloy layer 40 is deposited directly on the bonding layer 35 and the optional primary conductive layer 45 is deposited directly on the copper-zinc alloy layer 40.

In view of the properties of the copper-zinc alloy layer 40, it becomes possible to use an ultra-thin bonding layer 35. Preferably, the thickness of the bonding layer 35 is limited to a few monolayers. For example, the bonding layer thickness may be between 10–20 angstroms and, more preferably, less than about 15 angstroms.

The bonding layer 35 functions principally as an adhesion promoter to bond the copper-zinc alloy layer 40 to the dielectric layer 25. The copper barrier characteristics of the bonding layer material are generally not as important as its bonding characteristics. This is due to the inherent self-passivation and copper-confinement properties of the copper-zinc alloy layer 40. The present inventors have found that conducting materials that will bond with the dielectric and provide the requisite adhesion will also normally bond well with the copper of the copper-zinc alloy layer 40. Many such materials, however, have higher resistivities than copper. Since an ultra-thin layer of the bonding material is used, however, the bonding layer 35 does not significantly contribute to the resistance of the multilayer metallization structure 20. As such, several metals and alloys may be used as the bonding layer material. These include: Al, B, Hf, Ta, Ti, Zn, Cu, Pd, SiC, TiZn, V, Nb, Sb, Sn, nitrides, carbides, borides of refractory metals, and metallic compostructures. Generally stated, the bonding layer material may be any metal or alloy with a high magnitude free-energy of formation for the compounds that will form at the dielectric-metal interface (e.g. titanium carbide or aluminum oxide forming on a polymer/titanium interface, or silicon oxide/aluminum interface, respectively). Depending on the particular material chosen, the bonding layer 35 may be applied using one or more commonly known deposition techniques, such as PVD or CVD. As technology advances, the bonding layer 35 may ultimately be susceptible to application using an electrochemical deposition process.

The optional primary conducting layer 45 may be deposited on the copper-zinc alloy layer 40 to provide an even lower resistivity material that functions as the primary conductive path for electrical signals and, thus, reduces the overall resistance of the metallization structure 20. The optional primary conducting layer 45 may not be necessary in situations where the copper-zinc alloy layer 40 has a resistivity that is sufficiently low to meet the circuit or component requirements. The conducting layer 45 of the illustrated embodiment, in most applications, is preferably copper. The copper layer may be deposited using any of the known film deposition techniques. However, it is preferably deposited using an electrochemical deposition technique.

One of the unique layers employed in the metallization structure 20 is the copper-zinc alloy layer 40. The copper-zinc alloy layer 40 includes a very low zinc content. Preferably, the zinc content is below about 5 atomic percent. More preferably, the zinc content is below about 2 atomic percent. The present inventors have found that even those copper-zinc alloys having a zinc content below about 1 atomic percent exhibit properties that make them suitable for inclusion in the metallization structure 20. A balanced approach to choosing the zinc content is generally necessary. The greater the zinc content in the alloy, the greater is the resistivity of the resulting layer. To reduce the resistivity of the alloy layer, the zinc content of the alloy should be minimized. However, with reduced zinc content, the oxidation resistance and copper-confinement properties begin to degrade. As such, the zinc content should be chosen to balance the resistivity of the layer against the oxidation resistance and copper-confinement properties. The zinc content chosen for the alloy thus becomes dependent on the performance requirements of the metallization structure 20.

It is the properties of the copper-zinc alloy layer 40 that allow it to be used in conjunction with the very thin bonding layer 35. By using an ultra-thin bonding layer, microstructures that are filled using the sequence of layers of metallization structure 20 include a larger proportion of high-conductivity to low-conductivity materials than can be obtained when using the thicker bonding/barrier layers that are necessary when a pure copper layer is employed without an intermediate copper-zinc alloy layer.

The copper-zinc alloy layer 40 may be deposited using sputtering techniques or, as will be set forth in greater detail below, electrochemical deposition techniques. When the layer 40 is sputter deposited, the alloy composition is generally determined by the composition of the target. Alloy layers having different zinc content are thus generally sputter deposited using different copper-zinc composition targets.

Figure 2:
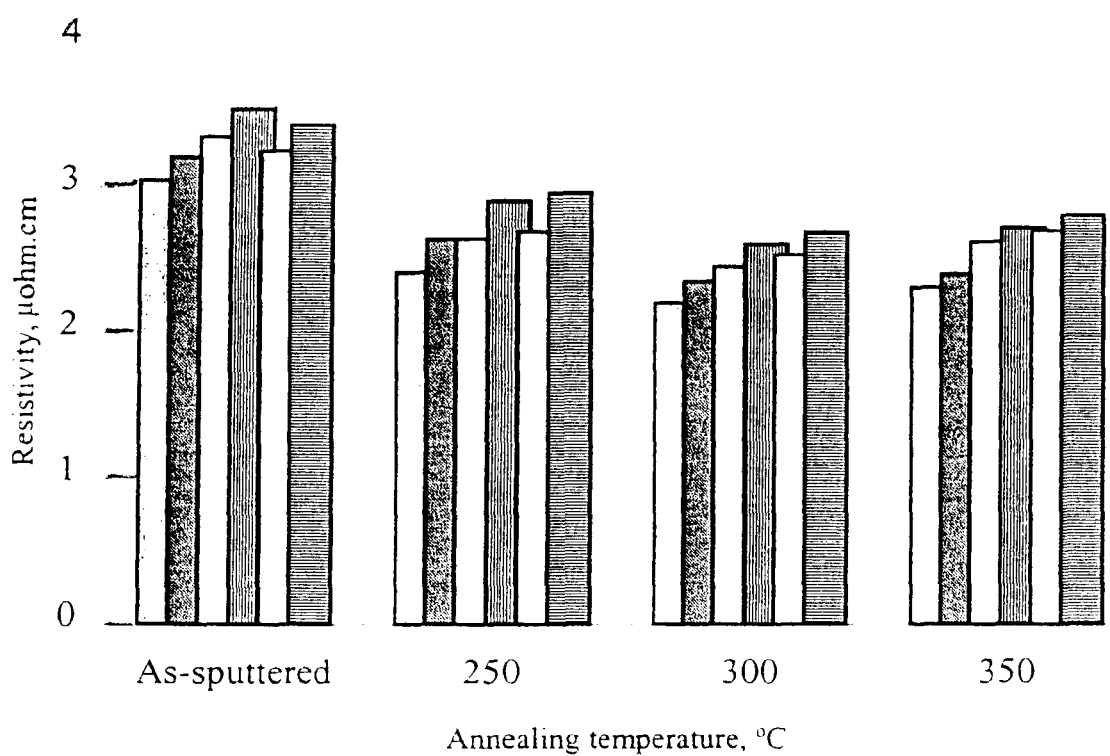
FIG. 2 is a chart showing the relationship between the resistivity of a copper-zinc alloy layer as a function of the annealing temperature.

Notwithstanding the particular deposition technique used to deposit the layer, the present inventors have found that the resistivity of the copper-zinc alloy layer 40 may be reduced using a low-temperature annealing process. FIG. 2 is a chart showing the relationship between the resistivity of a copper-zinc alloy layer as a function of the annealing temperature for a number of samples in which the copper-zinc alloy was sputter deposited on the dielectric material. The sputtering was done at 2.5 kW (0.5 k volt×5 amps) with a base pressure of $10^{-7}$ Torr and an argon pressure of 5 mTorr for 10 minutes. The annealing took place at the given temperatures for a time period of 30 minutes. The sputter target had a zinc content of 5 atomic percent.

As illustrated, annealing under the foregoing conditions generally improved the resistivity of the copper-alloy layer when compared to the resistivity of the layer as originally deposited. The results show a general decrease in resistivity with increasing annealing temperature. However, the resistivity was not significantly enhanced with increasing annealing temperatures above about 350° C.–400° C. As such, given the diminishing resistivity enhancement provided above such temperatures, it has been found to be preferable to anneal the copper-zinc alloy layer at an annealing temperature that is at or below this temperature range, thereby increasing the available thermal budget of the microelectronic workpiece (e.g., a semiconductor wafer). The annealing process may take place at an even lower temperature when one or more of the layers of the overall microelectronic workpiece degrade or are otherwise stressed when subject to high annealing temperatures. For example, many low-K dielectric materials begin to degrade at temperatures above about 250 ° C.–350° C. As such, annealing must take place below such temperatures.

Although the copper-zinc alloy layer 40 may be deposited using a sputter deposition process, acid copper electroplating is becoming popular and it has a number of advantages over other types of deposition. It is relatively fast, inexpensive, easy to maintain and control, less toxic and produces deposits of good uniformity, strength and ductility. Copper and zinc, however, are widely separated in electrochemical series ($E_{Cu/Cu2+}$=+0.34 and $E_{Zn/Zn2+}$=−0.76 mV with respect to Standard Hydrogen Electrode, SHE). In an acid medium, where both metals exist as simple cations, namely $Cu^{2+}$ and $Zn^{2+}$, it is therefore not possible to co-deposit both copper and zinc. When an attempt is made to electrochemically deposit two different metals having different deposition potentials from an electroplating solution, the metal having the lower magnitude deposition potential will generally plate out from the solution and a significant amount of gas will evolve before reaching the greater magnitude deposition potential of the other metal. So it therefore becomes necessary to think of chemicals, which when added to a system containing simple cations, bring the disparate deposition potentials proximate one another so that the metals can be co-deposited. To this end, complexing agents (coordinating ligands) such as cyanide, ethylenediamine, EDTA etc., may be used. These ligands coordinate with copper ions and form what are called coordinate complexes of copper thereby reducing the activity of copper and, hence, the electrode potentials. In other words, in the presence of complexing agents, the reduction potentials and, thus, the potentials at which the metals are electrodeposited, are shifted to more negative regions. The extent to which they are shifted is different for different elements. The present inventors have exploited this phenomenon to electroplate a thin film copper layer with very small amounts of zinc of less than 5 atomic percent and, more preferably, around about 1 atomic percent, and below.

To facilitate the electroplating of both copper and zinc to form the copper-zinc alloy layer 40, a unique electroplating solution for electrochemically depositing a copper-zinc alloy was developed. The preferred solution may be used in the electrochemical deposition of the copper-zinc alloy layer 40 of the metallization structure 20 shown in FIG. 1, as well as in the electrochemical deposition of other copper-based alloys used for the alloy layer 40 of structure 20. In accordance with a preferred composition of the solution, the solution includes the following constituents:

TABLE 1

PREFERRED ELECTROPLATING SOLUTION

| CONSTITUENT | CONCENTRATION | FUNCTION |
|---|---|---|
| MeSO$_4$ | 10–40 g/l | Used as a source of metal, Me, that is to be alloyed with the copper (Me = zinc, aluminum, boron, magnesium, Ce, etc.) |
| CuSO$_4$ | 5–20 g/l | Used as a source of copper for the metal alloy |
| (NH$_4$)$_2$SO$_4$ | 20–40 g/l | Used as a complexing agent |
| Addition agent | 0.1–1 ml/l | Preferably, ED or EDTA, serving as both a wetting agent as well as a complexing agent (optional constituent) |
| NH$_4$OH | 50–100 ml/l | Used to adjust the pH of the solution, which should be maintained between a pH of about 8 to a pH of about 11. This constituent also functions as a complexing agent. |

With the foregoing solution, it is possible to use a wide range of plating parameters to deposit a copper-zinc alloy layer 40 having a low resistivity (e.g., 1.8–2.4 u-ohms/cm) while also having the desired oxidation resistance and copper confinement properties. Preferably, the alloy is plated using a constant potential (a. opposed to a constant current) waveform. The plating potential used is preferably between 300 mV and 900 mV cathodic. Although a DC plating waveform may be used, it is preferable to have a forward pulsed waveform. The forward pulsed waveform may have an on/off cycle of 50/20 msec to 90/10 msec. Particularly good via and trench microstructure filling results when a waveform of 0.6/0.3 msec is used.

Figure 3A:
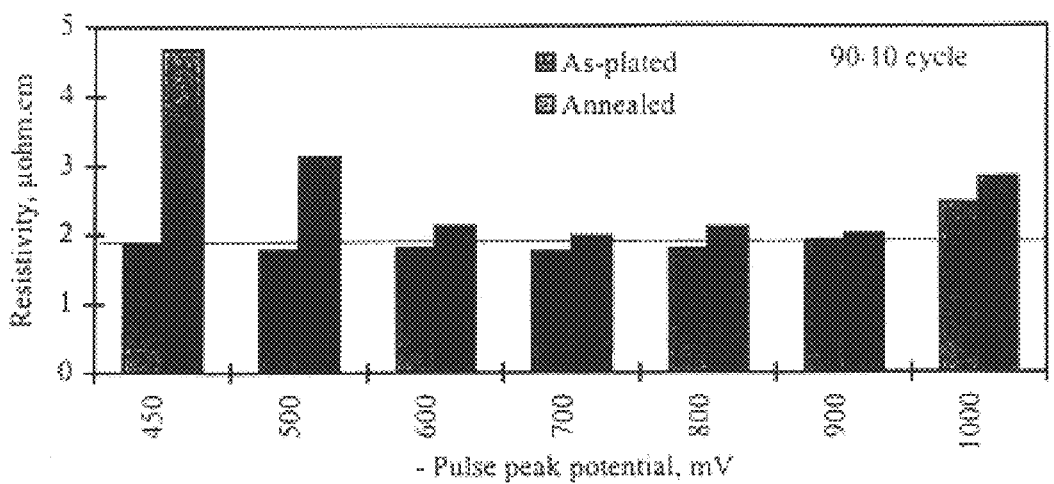
FIGS. 3A and 3B are charts illustrating the effect of pulse parameters on the resistivity of an electrochemically deposited copper-zinc alloy layer that has been deposited using an electroplating solution having a constituent composition in accordance with one embodiment of the present invention.
Figure 3B:
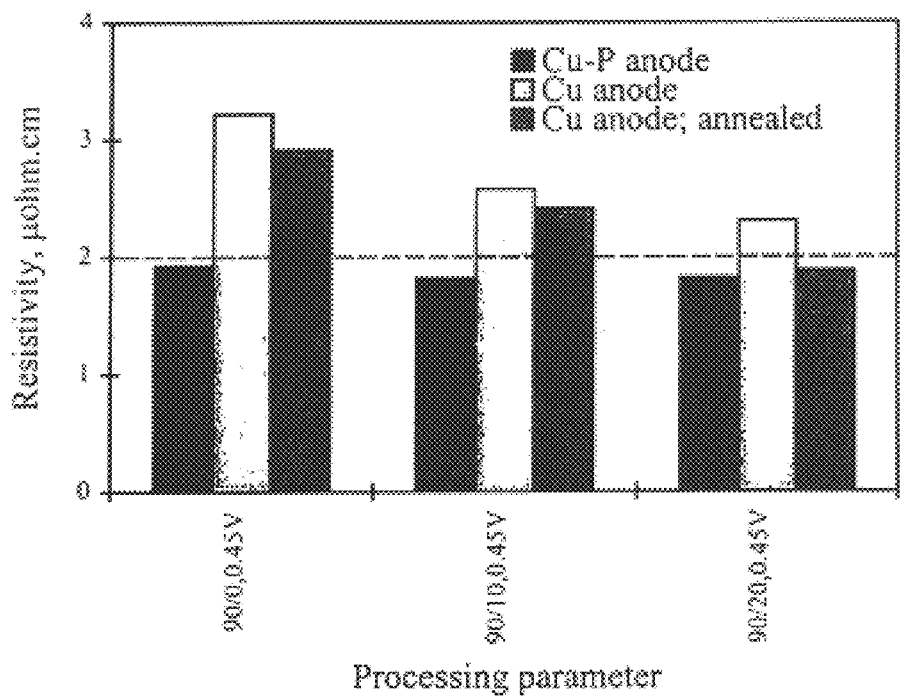
Figure 4:
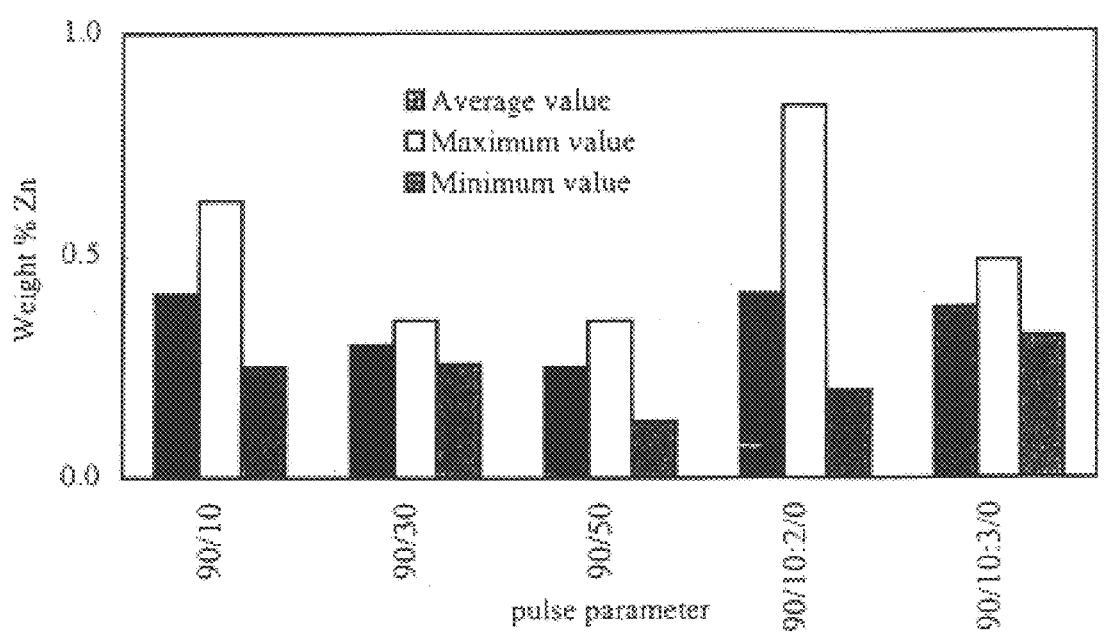
FIG. 4 is a chart illustrating the effect of pulse parameters on the zinc composition of an electrochemically deposited copper-zinc alloy that has been deposited using an electroplating solution having a constituent composition in accordance with one embodiment of the present invention.

FIGS. 3A and 3B are charts illustrating the effect of pulse parameters on the resistivity of the resulting copper-zinc alloy layer, while FIG. 4 is a chart illustrating the effect of pulse parameters on the zinc composition of the resulting layer. The rightmost pulse parameter results illustrated in of each of the figures included plating waveforms having reverse pulses as well as forward pulses. As can be seen from FIG. 4, the zinc content of the alloy may be manipulated by varying the pulse parameters.

Although an inert anode may be used in the deposition process, a consumable anode is preferred. The consumable anode may be comprised of pure copper or of copper-phosphorous, with the copper-phosphorus anode providing better microstructure filling and better copper-alloy layer characteristics.

Figure 5:
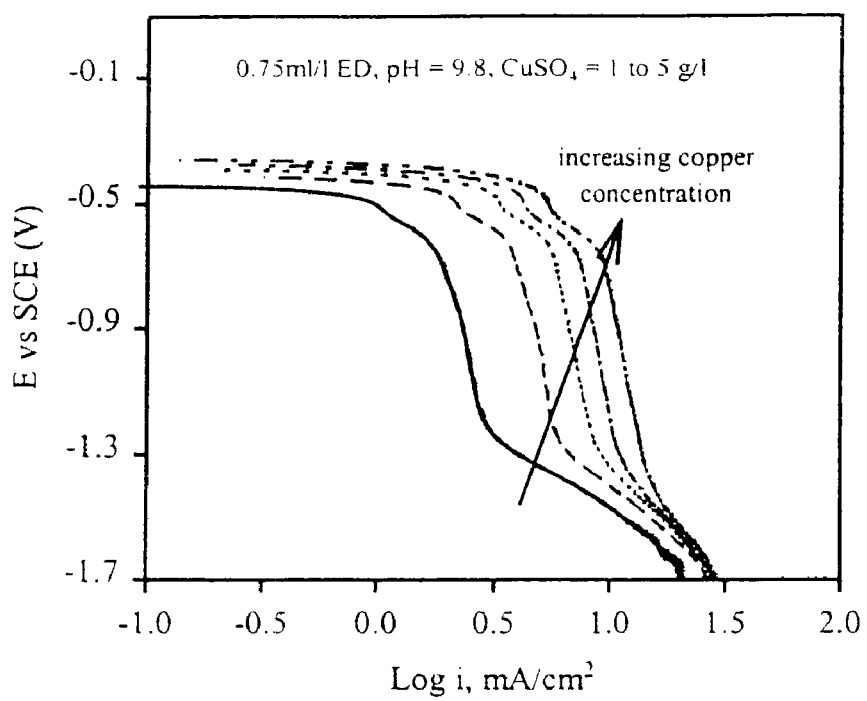
FIG. 5 is a graph illustrating the polarization behavior of a copper rod in copper sulfate solutions.
Figure 6:
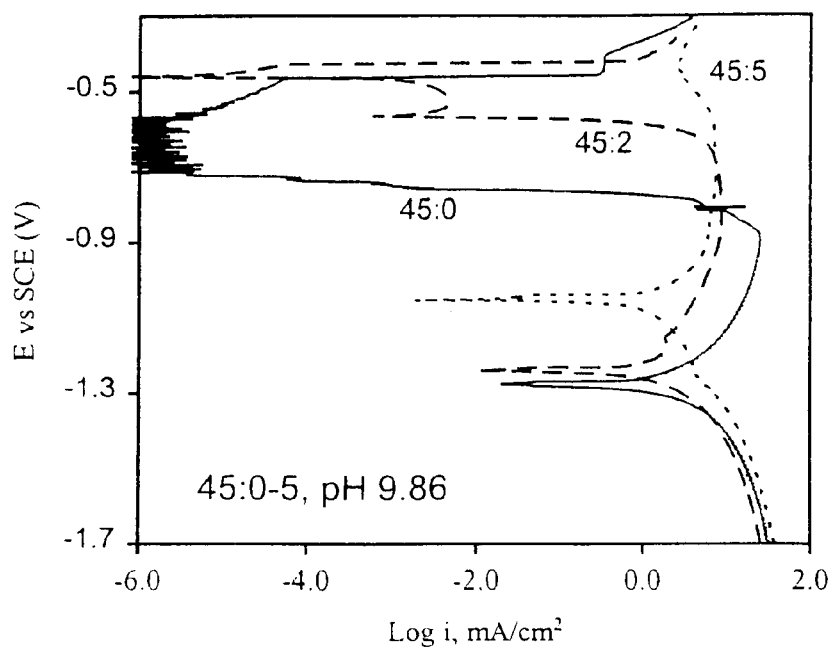
FIGS. 6–11 are graphs illustrating the cathodic polarization of a copper rod in plating solutions containing various quantities of zinc and copper sulfate.
Figure 7:
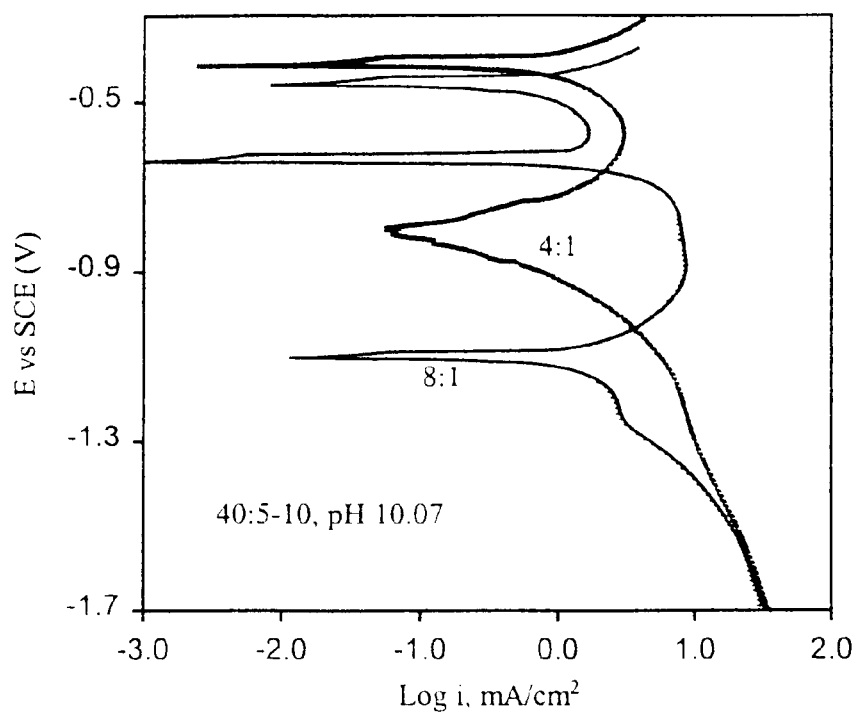
Figure 8:
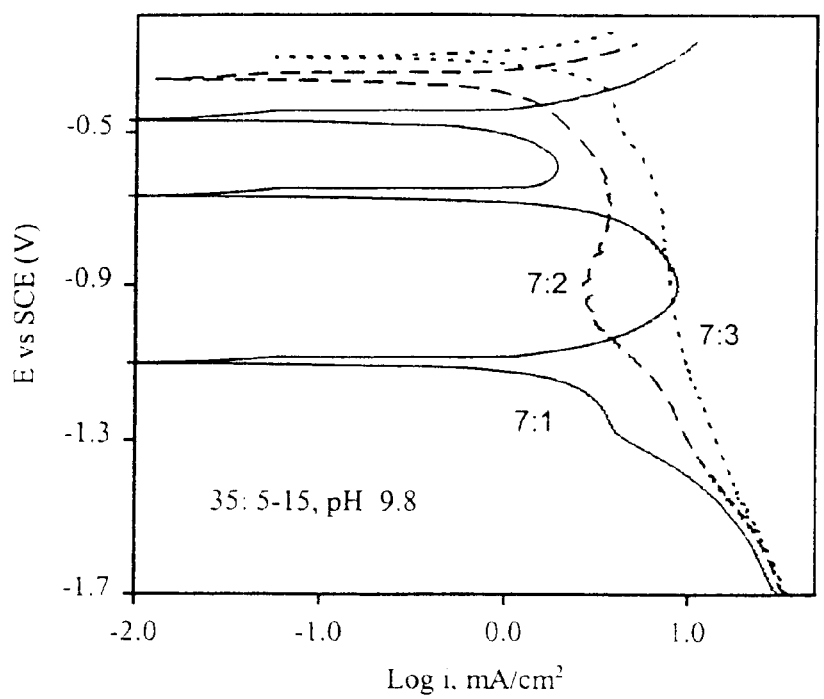
Figure 9:
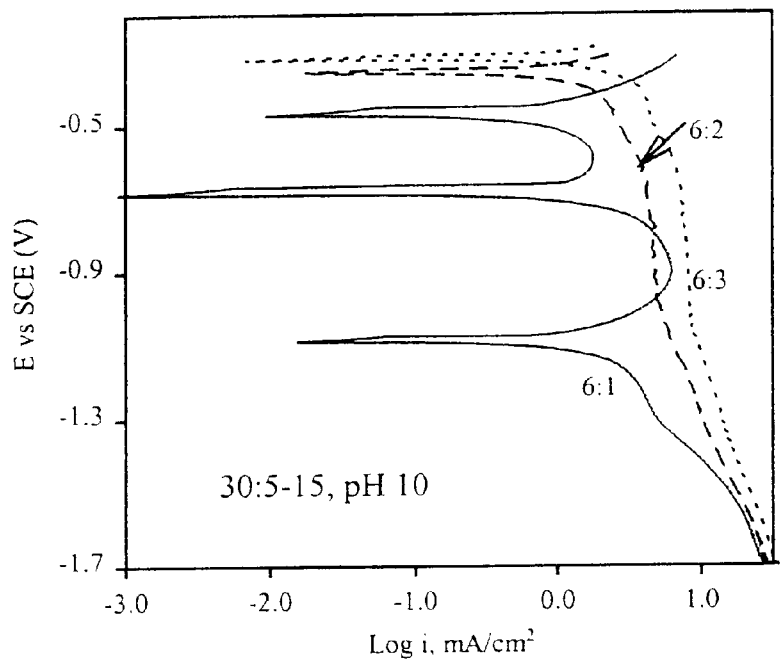
Figure 10:
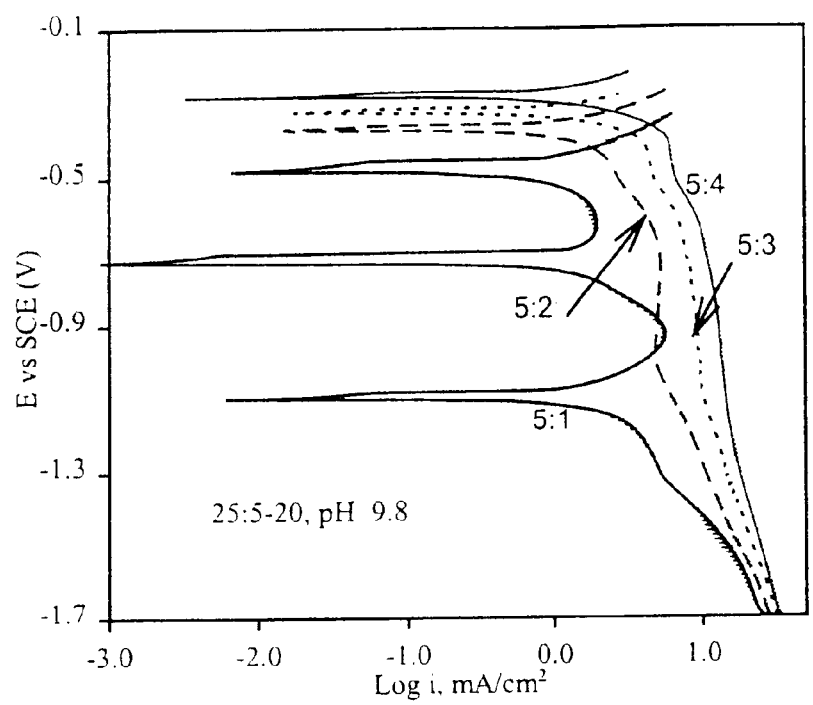
Figure 11:
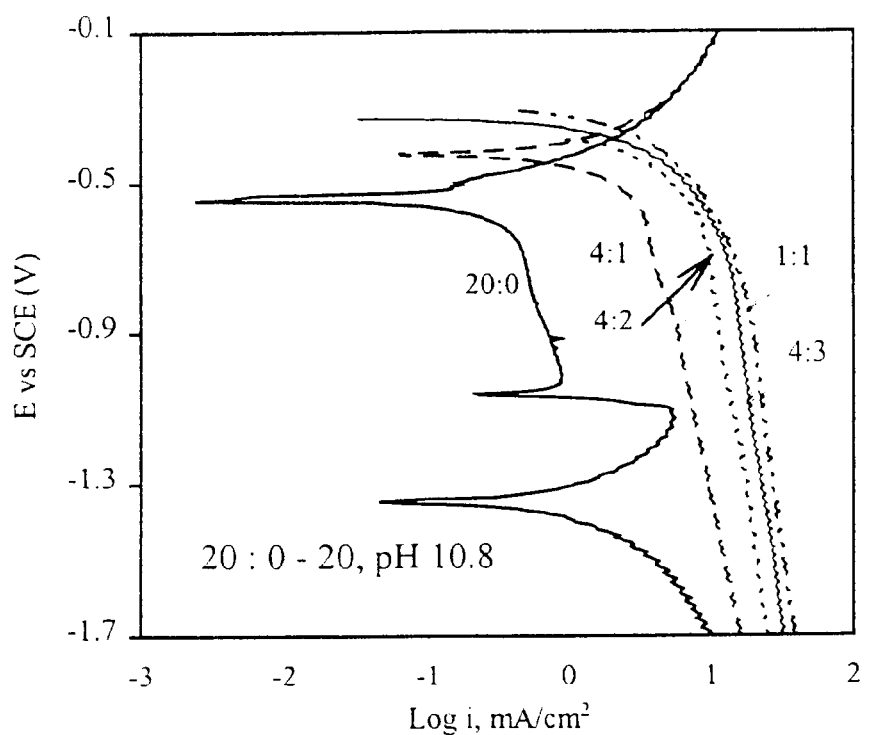

Various tests were performed to characterize the particular constituents used in the foregoing electroplating solution. For example, the polarization behavior of a copper rod in copper sulfate solutions is shown in FIG. 5. Increasing the concentration of copper in the bath shifted the SSP (Steady State Potential) to the anodic side. There did not appear to be any hydrogen evolution in the potential range studied.

The cathodic polarizations of a copper rod in plating solutions containing various quantities of zinc and copper sulfate are illustrated in FIGS. 6–11. When the ratio of zinc to copper is in the range 8:1 to 5:1, the polarization curves go through three minima, the first one at the highest negative potential corresponds to zinc deposition/dissolution, the other two correspond to a steady state region of alloy of copper and zinc. The increase in copper content in solution shifts the curves upwards to more positive potentials. Though the ratio varies, the total amount of copper in all these examples is the same: 5 g/l. Only when the copper concentration is increased from this level to 10 g/l (in 30:10 combination, where the ratio is 3:1, but total copper sulfate concentration is 10 g/l), do the two minima at negative potentials disappear and leave only one SSP at high positive potential. This is due to the fact that the solution attains a copper dissolution/deposition equilibrium. Two parameters were thus identified: the ratio of copper sulfate to zinc sulfate in solution and the concentration of copper sulfate. Unless the copper concentration is increased above 10 g/l, it does not appear to be possible to avoid the minima at higher negative potentials. By increased addition of copper to zinc sulfate (Ratio 1:1 and copper at 20 g/l level), the current is not increased significantly. This is due to complexation, but there is an advantage of stability of the solution where the concentration decrease due to plating may not change the current density significantly. Thus it is best to utilize a composition that allows the solution to work over a wide range of potentials to obtain the same composition of the deposit.

Figure 12:
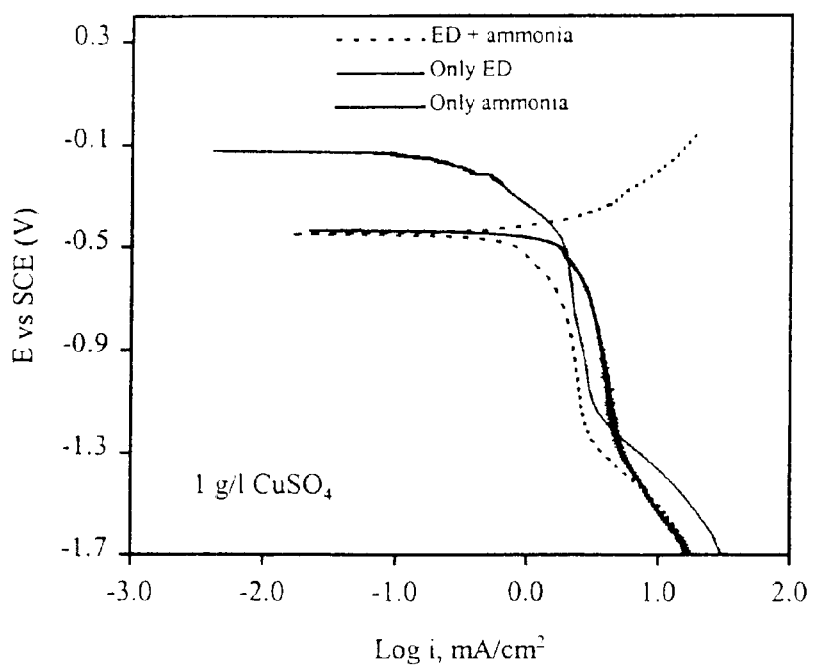
FIG. 12 is a graph illustrating the polarization response of copper in a solution containing 1 g/l of copper sulfate and others solution constituents.

FIG. 12 shows the polarization response of copper in a solution containing 1 g/l copper sulfate. The presence of ammonium hydroxide induces the formation of aminocomplexes, whereas the addition of ethylene amine induces the formation of ethylene amine complexes of metallic ions present in the solution. Whenever a complex ion is formed (by the reaction of metal ions with coordinating ligands present in solution), the activity of metal ions is reduced and this in turn reduces the deposition potential. The complexation also increases the overpotential and decreases the cathodic current density. These effects can be seen in this polarization curve. When only the amine is present, the steady state potential is around −1 V (SCE). Thus at potentials more negative to this, deposition of copper is possible. When ammonium hydroxide is present in test solution, the SSP is depressed to a higher negative value, to −0.47 V(SCE). This indicates that the complex formed with ammonia can be reduced only at higher negative potentials. The following equations represent the sequence of reactions that lead to the deposition of copper from complexes.

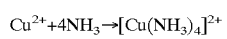

$$Cu^{2+}+4NH_3 \rightarrow [Cu(NH_3)_4]^{2+}$$

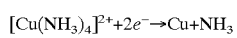

$$[Cu(NH_3)_4]^{2+}+2e^- \rightarrow Cu+NH_3$$

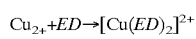

$$Cu_{2+}+ED \rightarrow [Cu(ED)_2]^{2+}$$

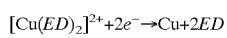

$$[Cu(ED)_2]^{2+}+2e^- \rightarrow Cu+2ED$$

Figure 13:
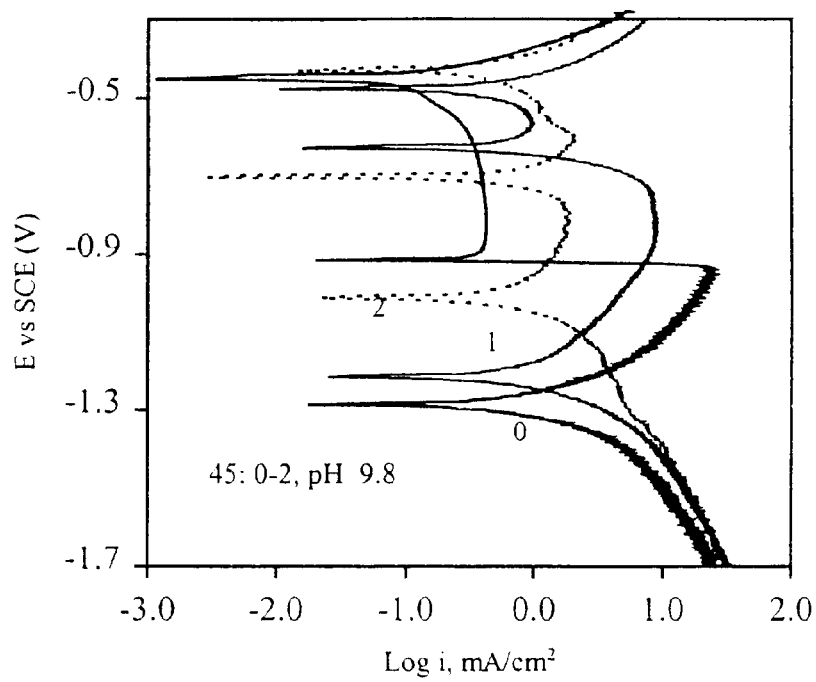
FIG. 13 is a graph illustrating polarization curves for plating solutions containing 45 g/l $ZnSO_4$ and various quantities of $CuSO_4$.

FIG. 13 illustrates the potentiodynamic polarization curves in plating solutions containing 45 g/l ZnSO$_4$ and various quantities of CuSO$_4$. The curves show active deposition/dissolution regions that correspond to that of zinc, copper and/or an alloy of these metals. The reduction of zinc complex to zinc occurred at potentials negative to −1.3 V (SCE) when the bath contained only zinc sulfate and no copper sulfate. The addition of 1 and 2 g/l copper sulfate resulted in this potential shifting to more anodic values, to −1.2 and −1.0 V (SCE) respectively. The steady state region that corresponds to that of pure zinc was masked by the simultaneous copper deposition. The extent to which this occurred depended on the amount of copper in the bath. Thus even before zinc that deposited at higher potentials dissolved, copper/copper alloy started to deposit. To observe the cross section of the cathodically polarized specimens, the experiment was terminated when the current in the cathodic region went below 100 µA (approximately at −0.5 V SCE). The specimen was then polished to observe the layers from surface to inside. As illustrated in FIG. 14, the layers were seen to be copper, Cu—Zn alloy and zinc as viewed from from the deposit surface to copper rod/deposit interface.

The electrochemical deposition of the copper-zinc alloy layer 40 may be implemented in a wide range of electroplating reactor types. An integrated processing tool that incorporates one or more electroplating reactors that are particularly suitable for implementing the foregoing electrochemical deposition process is available from Semitool, Inc., of Kalispell, Mont. Such tools are sold under the brand names LT-210™ and Equinox™ and are readily adapted to implement a wide range of electroplating processes used in the fabrication of microelectronic circuits and components. Advantageously, the reactors employed in these tools rotate a workpiece during the electrochemical deposition process, thereby enhancing the uniformity of the resulting film. It is preferable to rotate a workpiece when depositing the copper-zinc alloy layer 40 (or other alloy layer) onto the workpiece. To further enhance the quality of the resulting copper-Zn alloy layer 40, the electrochemical deposition reaction chamber(s) of these tools may be fitted with an ultrasonic generator that provides ultrasonic energy to the electroplating solution during the electrochemical deposition process to thereby enhance the desired characteristics of the resulting alloy layer.

In addition to electroplating reactors, such tools frequently include other ancillary processing chambers such as, for example, pre-wetting chambers, rinsing chambers, etc., that are used to perform other processes typically associated with electrochemical deposition. Semiconductor wafers, as well as other microelectronic workpieces, are processed in such tools one-by-one in the reactors and are transferred between the processing stations, as well as between the processing stations and input/output stations, by a robotic transfer mechanism. The robotic transfer mechanism, the electroplating reactors and the plating recipes used therein, as well as the components of the processing chambers are all under the control of one or more programmable processing units.

Numerous modifications may be made to the foregoing inventions without departing from the basic teachings thereof. Although the present inventions have been described in substantial detail with reference to one or more specific embodiments, those of skill in the art will recognize that changes may be made thereto without departing from the scope and spirit of the invention as set forth in the appended claims.

What is claimed is:

1. A metallized structure for use in a microelectronic circuit, the metallized structure comprising:
    a dielectric layer;
    an ultra-thin film bonding layer disposed exterior to the dielectric layer; and
    a low-Me concentration, copper-Me alloy layer disposed exterior to the ultra-thin film bonding layer.

2. A metallized structure as set forth in claim 1 wherein the dielectric layer is formed from a low-K dielectric material.

3. A metallized structure as set forth in claim 1 wherein the dielectric layer is formed from a high-K dielectric material.

4. A metallized structure as set forth in claim 1 wherein the Me content of the copper-Me alloy layer is less than or equal to about 5 atomic percent.

5. A metallized structure as set forth in claim 1 wherein the zinc content of the copper-Me alloy layer is less than or equal to about 2 atomic percent.

6. A metallized structure as set forth in claim 1 wherein the zinc content of the copper-Me alloy layer is less than or equal to about 1 atomic percent.

7. A metallized structure as set forth in claim 1 wherein the ultra-thin bonding layer has a thickness between about 10–20 angstroms.

8. A metallized structure as set forth in claim 7 wherein the ultra-thin bonding layer has a thickness of less than about 15 angstroms.

9. A metallized structure as set forth in claim 1 wherein the ultra-thin bonding layer is comprised of a metal.

10. A metallized structure as set forth in claim 1 wherein the ultra-thin bonding layer is comprised of a metal alloy.

11. A metallized structure for use in a microelectronic circuit, the metallized structure comprising:
    a dielectric layer;
    an ultra-thin film bonding layer disposed exterior to the dielectric layer; and
    a low-zinc concentration, copper-zinc alloy layer disposed exterior to the ultra-thin film bonding layer.

12. A metallized structure as set forth in claim 11 and further comprising a primary copper conductor disposed exterior to the low-zinc concentration, copper-zinc alloy layer.

13. A metallized structure as set forth in claim 11 wherein the dielectric layer is formed from a low-K dielectric material.

14. A metallized structure as set forth in claim 11 wherein the dielectric layer is formed from a high-K dielectric material.

15. A metallized structure as set forth in claim 11 wherein the zinc content of the copper-zinc alloy layer is less than or equal to about 5 atomic percent.

16. A metallized structure as set forth in claim 11 wherein the zinc content of the copper-zinc alloy layer is less than or equal to about 2 atomic percent.

17. A metallized structure as set forth in claim 11 wherein the zinc content of the copper-zinc alloy layer is less than or equal to about 1 atomic percent.

18. A metallized structure as set forth in claim 11 wherein the ultra-thin bonding layer has a thickness between about 10–20 angstroms.

19. A metallized structure as set forth in claim 18 wherein the ultra-thin bonding layer has a thickness of less than about 15 angstroms.

20. A metallized structure as set forth in claim 11 wherein the ultra-thin bonding layer is comprised of a metal.

21. A metallized structure as set forth in claim 11 wherein the ultra-thin bonding layer is comprised of a metal alloy.

22. A metallized structure for use in a microelectronic circuit, the metallized structure comprising:
    a dielectric layer;
    an ultra-thin film bonding layer disposed adjacent to the dielectric layer; and
    a low-zinc concentration, copper-zinc alloy layer disposed adjacent to the ultra-thin film bonding layer.

23. A metallized structure as set forth in claim 22 and further comprising a primary copper conductor layer adjacent the low-zinc concentration, copper-zinc alloy layer.

24. A metallized structure as set forth in claim 22 wherein the dielectric layer is formed from a low-K dielectric material.

25. A metallized structure as set forth in claim 22 wherein the dielectric layer is formed from a high-K dielectric material.

26. A metallized structure as set forth in claim 22 wherein the zinc content of the copper-zinc alloy layer is less than or equal to about 5 atomic percent.

27. A metallized structure as set forth in claim 22 wherein the zinc content of the copper-zinc alloy layer is less than or equal to about 2 atomic percent.

28. A metallized structure as set forth in claim 22 wherein the zinc content of the copper-zinc alloy layer is less than or equal to about 1 atomic percent.

29. A metallized structure as set forth in claim 22 wherein the ultra-thin bonding layer has a thickness between about 10–20 angstroms.

30. A metallized structure as set forth in claim 29 wherein the ultra-thin bonding layer has a thickness of less than about 15 angstroms.

31. A metallized structure as set forth in claim 22 wherein the ultra-thin bonding layer is formed from a material with a high magnitude free-energy of formation for compounds that will form at the dielectric-bonding layer interface.

32. A metallized structure as set forth in claim 22 wherein the ultra-thin bonding layer is comprised of a metal.

33. A metallized structure as set forth in claim 22 wherein the ultra-thin bonding layer is comprised of a metal alloy.

34. A metallized structure for use in a microelectronic circuit formed by a process comprising the steps of:
   depositing a dielectric layer on the microelectronic workpiece;
   depositing an ultra-thin bonding layer over an exterior of the dielectric layer;
   depositing a low Me concentration, copper-Me alloy layer exterior to the ultra-thin bonding layer, where Me is a metal other than copper.

35. The metallized structure of claim 34, wherein the ultra-thin bonding layer is disposed immediately adjacent the dielectric layer and the copper-Me alloy layer is disposed immediately adjacent the ultra-thin bonding layer.

36. The metallized structure of claim 35, wherein the concentration of Me is less than about 5 atomic percent.

37. The metallized structure of claim 35, wherein the concentration of Me is less than about 2 atomic percent.

38. The metallized structure of claim 35, wherein the concentration of Me is less than about 1 atomic percent.

39. The metallized structure of claim 35, wherein Me is zinc.

40. The metallized structure of claim 36, wherein Me is zinc.

41. The metallized structure of claim 37, wherein Me is zinc.

42. The metallized structure of claim 38, wherein Me is zinc.

43. The metallized structure of claim 34, wherein the copper-Me alloy layer is deposited using an electrochemical deposition process.

44. The metallized structure of claim 43, wherein the electrochemical deposition process uses a constant potential waveform.

45. The metallized structure of claim 44, wherein the constant potential waveform comprises a forward pulsed waveform.

46. The metallized structure of claim 35, wherein the copper-Me alloy layer is deposited using an electrochemical deposition process.

* * * * *